United States Patent [19]

Nishioka et al.

[11] Patent Number: 5,538,905
[45] Date of Patent: Jul. 23, 1996

[54] METHOD FOR FORMING A TRANSPARENT CONDUCTIVE ITO FILM

[75] Inventors: Yukiya Nishioka, Higashiosaka; Yukinobu Nakata, Tenri; Hidenori Negoto, Ikoma; Yoshinori Shimada, Yamatokoriyama; Takehisa Sakurai, Kusatsu; Mikio Katayama, Ikoma, all of Japan

[73] Assignee: Sharp Kabushiki Kaisha, Osaka, Japan

[21] Appl. No.: 139,915

[22] Filed: Oct. 20, 1993

[30] Foreign Application Priority Data

Oct. 21, 1992 [JP] Japan .................... 4-283299

[51] Int. Cl.$^6$ .................... C23C 14/34; H01L 21/265
[52] U.S. Cl. .................... 437/24; 204/192.29
[58] Field of Search .................... 437/181, 16, 24; 427/639, 529, 523; 204/192.29

[56] References Cited

U.S. PATENT DOCUMENTS

| | | | |
|---|---|---|---|
| 4,121,238 | 10/1978 | Bachmann et al. | 357/1.6 |
| 4,277,517 | 7/1981 | Smith, Jr. | 427/9.6 |
| 4,733,284 | 3/1988 | Aoki | 357/23.7 |
| 4,842,705 | 6/1989 | Mueller | 204/192.29 |
| 5,011,585 | 4/1991 | Brochot et al. | 204/192.13 |
| 5,114,869 | 5/1992 | Tanaka et al. | 437/20 |
| 5,180,686 | 1/1993 | Benerjee et al. | 437/181 |
| 5,223,765 | 6/1993 | Staron et al. | 313/478 |
| 5,289,030 | 2/1994 | Yamazaki et al. | 257/410 |
| 5,289,300 | 2/1994 | Yamazaki et al. | 359/51 |
| 5,397,718 | 3/1995 | Furuta et al. | 437/40 |
| 5,403,756 | 4/1995 | Yoshinouchi et al. | 437/24 |
| 5,424,244 | 6/1995 | Zhang et al. | 437/247 |

FOREIGN PATENT DOCUMENTS

| | | |
|---|---|---|
| 0293645 | 12/1988 | European Pat. Off. . |
| 0385475 | 9/1990 | European Pat. Off. . |
| 0421015 | 4/1991 | European Pat. Off. . |
| 0447850 | 9/1991 | European Pat. Off. . |
| 4-68315 | 3/1992 | Japan . |
| WO-A-92/17620 | 10/1992 | WIPO . |

*Primary Examiner*—George Fourson
*Assistant Examiner*—S. Mulpuri
*Attorney, Agent, or Firm*—David G. Conlin; Kevin J. Fournier

[57] ABSTRACT

A method for forming a transparent conductive film includes the steps of: forming an ITO film on a substrate by sputtering a target including oxygen atoms, indium atoms, and tin atoms under an inert gas atmosphere; patterning the ITO film by selectively removing a prescribed portion of the ITO film using an etching method; and doping the patterned ITO film with oxygen using an ion shower doping method, thereby forming the transparent conductive film from the ITO film.

7 Claims, 2 Drawing Sheets

METHOD FOR FORMING A TRANSPARENT CONDUCTIVE ITO FILM

BACKGROUND OF THE INVENTION

1. Field of the Invention

The present invention relates to a transparent conductive film used in a liquid crystal display device or an electroluminescence (EL) display device.

2. Description of the Related Art

Conventionally, a transparent conductive film made of Indium Tin Oxide (ITO) has been widely used as a transparent conductive electrode for a liquid crystal display device or an EL display device, because such a transparent conductive film has various advantages in that it has low specific resistance and high visible light transmittance, and it can be subject to a wet etching step with an aqueous solution, etc.

FIG. 2 exemplarily shows an active matrix substrate using a transparent conductive film made of ITO as a pixel electrode. In this active matrix substrate, a plurality of pixel electrodes 106 are arranged in a matrix on a glass substrate. The pixel electrodes 106 are each connected to a thin film transistor (TFT). The TFT is used for a switching function to switch an electrical field applied between the respective pixel electrodes 106 and respective counter electrodes (not shown), and thus a display pattern is formed.

The process for fabricating such a conventional active matrix substrate will be described. First, a base insulating film 100 made of $Ta_2O_5$ is formed so as to entirely cover the substrate by sputtering. Next, a lower gate wiring 101 and an upper gate wiring 102 are formed on the base insulating film 100 by sputtering. The lower gate wiring is made of aluminum (Al) so as to reduce the resistance thereof. The upper gate wiring 102 may be made of a metal such as tantalum (Ta) which is capable of being anodized. Thereafter, the surface of the upper gate wiring 102 is anodized in electrolyte, and thus an anodic oxide film made of $TaO_x$ is formed. Then, a gate insulating film 107 made of $SiN_x$ is formed so as to entirely cover the substrate by a CVD method. The next step is that an intrinsic amorphous silicon semiconductor layer is formed on the anodic oxide film, and then a $SiN_x$ layer, which functions as an etching stopper 103, is formed thereon. In addition, an amorphous silicon of an $n^+$ type semiconductor layer 104 doped with P (Phosphorus) is formed so as to cover an edge portion of the etching stopper 103 and the semiconductor layer. Subsequently, a source/drain wiring 105 made of titanium (Ti) is formed by sputtering. The source/drain wiring 105 is made as a single layer. Thereafter, a transparent conductive film made of ITO is formed by sputtering, and then this film is patterned into the pixel electrode 106. Furthermore, a protective film 108 is formed on the transparent conductive film.

The above transparent conductive film is generally formed as follows: First, in a sputter chamber, a target made of indium oxide and tin oxide is arranged so as to face the substrate on which the transparent conductive film will be formed. Then the substrate is heated up to a temperature of around 280° C. Thereafter, the air in the sputter chamber is discharged so as to create a high vacuum atmosphere, and then a sputter gas made by adding several vl % (volume %) of gaseous oxygen to an argon gas is supplied to the sputter chamber at a prescribed gas pressure. Thereafter, an electric discharge is done between a substrate holder to hold the substrate and the target, and thus the sputtering process is performed. Finally, an ITO film is formed on the substrate.

The carrier density of the thus formed ITO film is reduced as the oxygen partial pressure of the ITO film is increased, or the oxygen deficiency of the ITO film is lowered. The reason is that the oxygen deficiency of the ITO film functions as a donor. On the other hand, the carrier mobility is increased as the oxygen deficiency of the ITO film is decreased. The specific resistance of the ITO film is lowered as the carrier density of the ITO film is increased, or the carrier mobility of the ITO film is increased. Therefore, in the case where the rate of the oxygen parts shows a prescribed value, the specific resistance of the ITO film shows a minimum value. The light transmittance of the ITO film is increased as the oxygen deficiency of the ITO film is decreased. On the other hand, the light transmittance of the ITO film is limited by the degree of the oxygen deficiency of the ITO film when the specific resistance of the ITO film shows the minimum value. Therefore, according to the above-mentioned method, the amount of the gaseous oxygen to be included in the sputter gas is adjusted so as to obtain an ITO film having a desired amount of oxygen.

However, the above-mentioned method has a problem in that it is difficult to control the wet etching step for forming a wiring pattern at a later stage, because the ITO film is formed with less oxygen deficiency due to the gaseous oxygen added to the sputter gas during the ITO film forming process.

SUMMARY OF THE INVENTION

The method for forming a transparent conductive film of this invention includes the steps of: forming an ITO film on a substrate by sputtering a target including oxygen atoms, indium atoms, and tin atoms under an inert gas atmosphere; patterning the ITO film by selectively removing a prescribed portion of the ITO film using an etching method; and doping the patterned ITO film with oxygen using an ion shower doping method, thereby forming the transparent conductive film from the ITO film.

In one embodiment, the target includes indium oxide containing about 10 wt % of tin oxide.

In another embodiment, the step for forming the ITO film comprises a step for creating the inert gas atmosphere by supplying an argon gas alone to a vacuum vessel having an inner pressure of $3.0 \times 10^{-4}$ Pa or less.

In still another embodiment, the step for forming the ITO film comprises a step for supplying the argon gas having a pressure of 0.24 Pa to the vacuum vessel.

In still another embodiment, at the step for doping the ITO film with the oxygen, a dose amount of the oxygen is from $10^{16}$ to $10^{17}$ ions/cm$^2$.

In still another embodiment, further comprising a step for heating the transparent conductive film.

In still another embodiment, at the step for patterning the ITO film, the prescribed portion of the ITO film is removed by using a wet etching method.

In still another embodiment, the step for patterning the ITO film comprises a step for forming a resist film provided with an opening which defines the prescribed portion of the ITO film on the ITO film, a step for selectively removing the prescribed portion of the ITO film which is exposed through the opening of the resist film, and a step for removing the resist film.

Thus, the invention described herein makes possible the advantage of providing a method for forming a transparent conductive film having high transmittance and low specific resistance, which can be readily patterned into a wiring pattern.

This and other advantages of the present invention will become apparent to those skilled in the art upon reading and understanding the following detailed description with reference to the accompanying figures.

DESCRIPTION OF THE PREFERRED EMBODIMENTS

Figure 2:
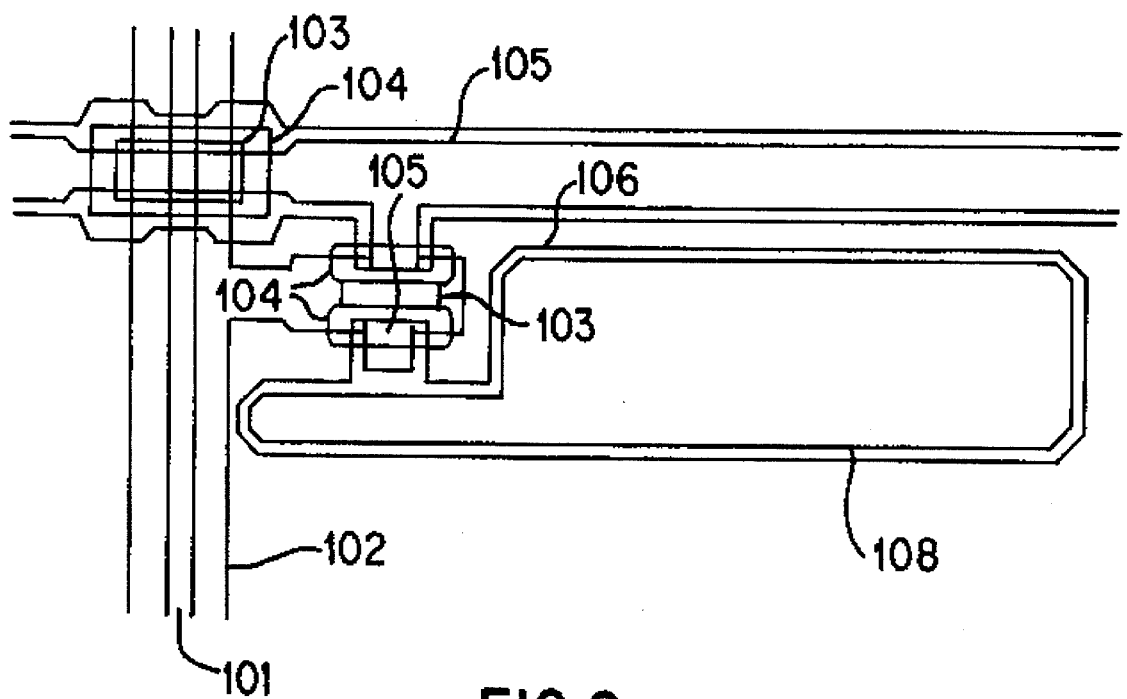
FIG. 2 shows a plan view of an active matrix substrate.

Hereinafter, a method for forming an transparent conductive film according to the present invention will be described by way of illustrating an example referring to drawings. In the present example, the method for forming the transparent conductive film is applied to an active matrix substrate shown in FIG. 2.

First, a base insulating film 100 made of tantalum oxide ($Ta_2O_5$) is formed so as to entirely cover a base substrate 110 by sputtering. Next, a lower gate wiring 101 and an upper gate wiring 102 are formed on the base insulating film 100 by sputtering. The lower gate wiring 101 may be made of aluminum (Al) so as to reduce the wiring resistance. The upper gate wiring 102 may be made of a metal such as tantalum (Ta) capable of being anodized. Thereafter, the surface of the upper gate wiring 102 is anodized in electrolyte, and thus an anodic oxide film made of $TaO_x$ is formed. Then, a gate insulating film 107 made of $SiN_x$ is formed so as to entirely cover the substrate by a CVD method. The next step is that an intrinsic amorphous silicon semiconductor layer is deposited on the anodic oxide film formed on the surface of the upper gate wiring 102, and then a $SiN_x$ layer, which functions as an etching stopper 103, is formed thereon. In addition, an amorphous silicon of $n^+$ type semiconductor layer 104 doped with P (phosphorus) is formed so as to cover an edge portion of the etching stopper 103 and the semiconductor layer. Subsequently, a source/drain wiring 105 made of titanium (Ti) is formed by sputtering. The source/drain wiring 105 is made as a single layer.

Thereafter, an ITO film is formed on the thus formed substrate 4 by sputtering.

Figure 1:
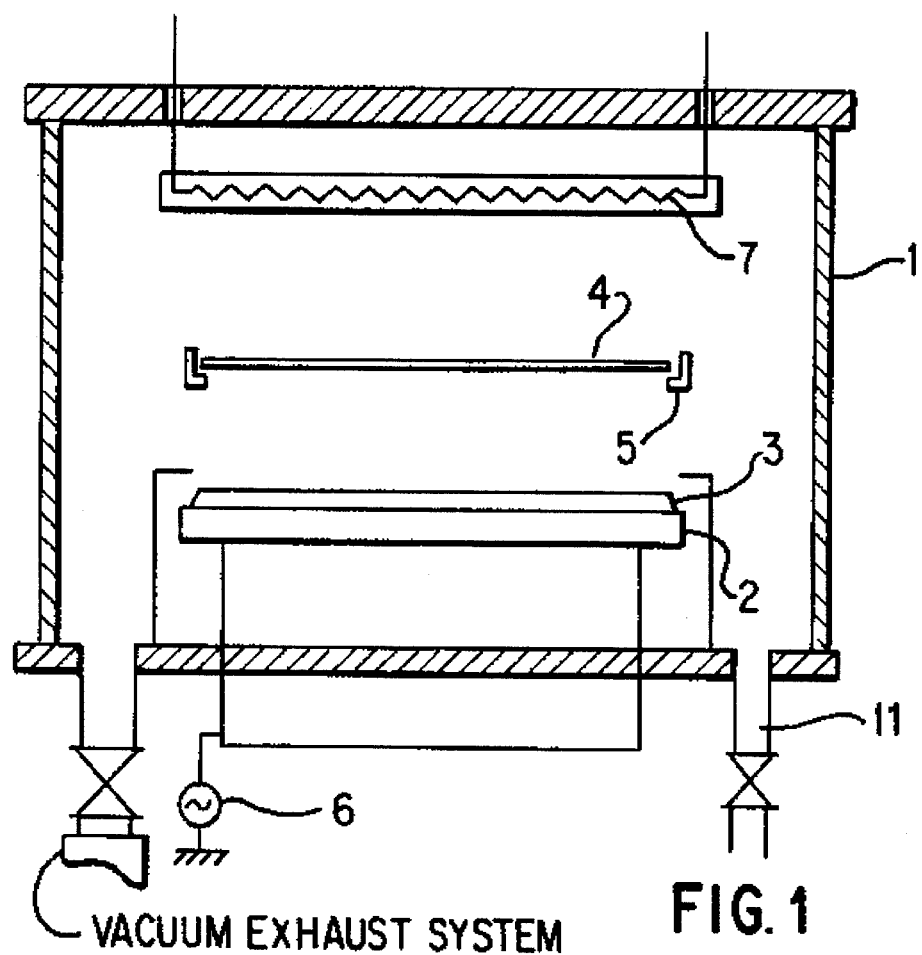
FIG. 1 shows a cross-sectional view of a sputtering apparatus according to an example of the present invention.
Figure 3A:
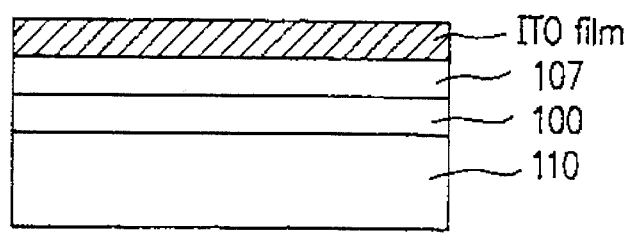
FIGS. 3A to 3E exemplarily shows a sequence of steps for forming a transparent conductive film according to the present invention.

Next, a sputtering process is performed in a sputtering apparatus shown in FIG. 1 as follows: First, in a vacuum vessel (sputter chamber) 1, a target 3 made by adding about 10 wt % (weight %) of tin oxide ($SnO_2$) to indium oxide ($In_2O_3$) is retained by a target electrode 2 with magnetic force. The substrate 4 is arranged at a sputter holder 5 above the target 3 so that the laminated materials including the source/drain wiring 105, etc. face the target 3. Then, the substrate 4 is heated by a heater 7 up to a temperature from 250° to 300° C., preferably up to a temperature of about 280° C. Under this condition, the air in the vacuum vessel 1 is discharged so as to create a high vacuum atmosphere ($3.0 \times 10^{-4}$ Pa or less), and then an inert gas, herein an argon (Ar) gas having a pressure of about 0.24 Pa, is supplied from a sputter gas tube 11 to the vacuum vessel 1. Under the condition, 0.5 kW of electric power is supplied from a high-frequency power source 6 to the target electrode 2 so that an electric discharge is done between the target 3 and the substrate 4, and thus the sputtering process is performed. Finally, the ITO film is formed on the substrate 4 as is shown in FIG. 3A.

Figure 3B:
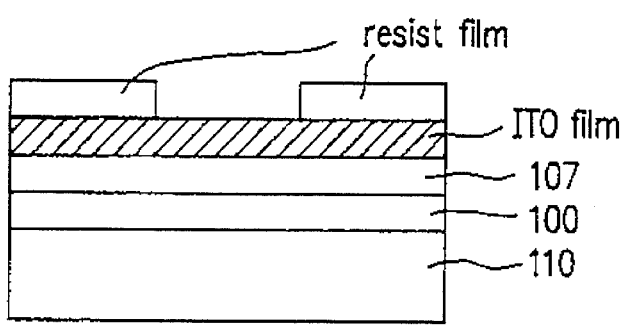
Figure 3C:
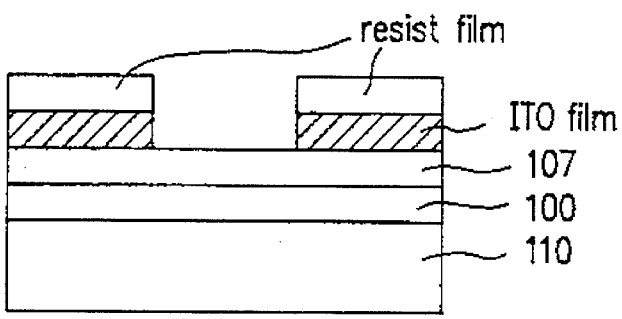
Figure 3D:
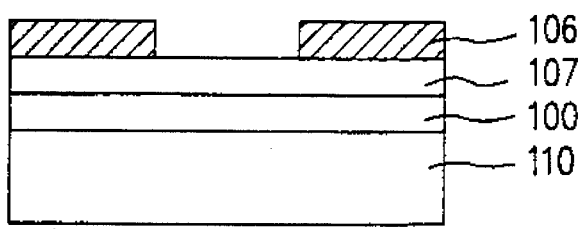
Figure 3E:
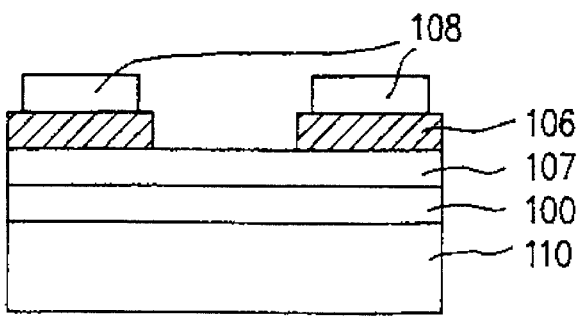

Thereafter, the transparent conductive film is formed by using a photolithography technique as follows: First, as is shown in FIG. 3B, a resist film provided with an opening which defines the prescribed portion of ITO film is formed on the ITO film. Thereafter, as is shown in FIG. 3C, the prescribed portion of the ITO film which is exposed through the opening of the resist film is removed by using a wet etching method, and thus the ITO film is patterned. Subsequently, as is shown in FIG. 3D, the resist film is removed, and then the patterned ITO film is doped with $O_2$ by an ion shower doping method, thereby forming a pixel electrode 106. Furthermore, a protective film 108 is formed on the pixel electrode 106 by a plasma CVD method as is shown in FIG. 3E. When the protective film 108 is formed, the substrate 4 is heated, and thus the ITO film is further calcined.

Accordingly, the active matrix substrate of the present invention is formed. Herein, the target 3 to be used at the above sputtering process includes indium oxide containing tin oxide in an amount of about 10 wt %, and the sputter gas to be used in the sputtering process substantially includes argon gas alone. Therefore, the metal parts of the resulting ITO film are increased and the oxide parts thereof are decreased in amount. With such a metal-rich ITO film, it becomes easy to control the etching step during the wiring patterning process after the ITO film forming process. In the present example, the wet etching method is employed, but a dry etching method may also be employed to carry out the present invention.

Moreover, it is possible to adjust the amount of oxygen to be included in the ITO film by adjusting the dose amount of the oxygen during the above ion shower doping process. Accordingly, the transparent conductive film obtained as a pixel electrode includes an appropriate amount of oxygen, and has excellent light transmittance and low specific resistance. In addition, the ITO film can partially be doped with different amount of oxygen, so that a portion of the ITO film not corresponding to the pixel electrode can be made to include less amount of oxygen than that of a portion corresponding to the pixel electrode. Accordingly, the portion of the ITO film corresponding to the pixel electrode can be made to have further lower resistance.

According to the present example, in the case where the ion shower doping process is performed so that the dose amount of oxygen is $10^{16}$ to $10^{17}$ ions/cm$^2$ a transparent conductive film is obtained with high transparency of 85% or more, and low specific resistance of about 1.5 to about $2.0 \times 10^{-4}$ $\Omega$.cm. That is, according to the present invention, it is possible to provide a transparent conductive film having an excellent transmittance, and a specific resistance lower than that of the conventional transparent conductive film.

The thus obtained transparent conductive film can be applied widely, such as an electrode or a wiring material, not only to a liquid crystal display device but also to an EL display device and the other information processing devices. In addition, the present invention can be applied not only to an active matrix type liquid crystal display device using TFTs, but also to the other active matrix type liquid crystal display devices using MIMs (metal-insulating layer-metals), diodes, FETs (bulk transistors), varistors, etc., as well as a simple matrix type liquid crystal display device.

As is apparent from the above, according to the method of the present invention, it is possible to obtain a transparent conductive film having high transmittance and low specific resistance, which can be readily patterned into a wiring pattern.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for forming a transparent conductive film, comprising the steps of:

forming an ITO film on a substrate by sputtering a target under an inert gas atmosphere, said target including oxygen atoms, indium atoms, and tin atoms, said ITO film being oxygen-deficient;

patterning said ITO film by selectively removing a portion of said ITO film using an etching method;

doping said patterned ITO film with oxygen ions using an ion shower doping method; and heating said patterned and doped ITO film, thereby forming said transparent conductive film from said patterned ITO film.

2. A method according to claim 1, wherein said target containing about 10 wt % of tin oxide.

3. A method according to claim 1, wherein, said step for forming said ITO film comprises a step for creating said inert gas atmosphere by supplying an argon gas alone to a vacuum vessel having an inner pressure of $3.0 \times 10^{-4}$ Pa or less.

4. A method according to claim 3, wherein said step for forming said ITO film comprises a step for supplying said argon gas having a pressure of 0.24 Pa to said vacuum vessel.

5. A method according to claim 1, wherein, at said step for doping said patterned ITO film with said oxygen, a dose amount of said oxygen is from $10^{16}$ to $10^{17}$ ions/cm$^2$.

6. A method according to claim 1, wherein, at said step for patterning said ITO film, said portion of said ITO film is removed by using a wet etching method.

7. A method according to claim 1, wherein, said step for patterning said ITO film comprises a step for forming a resist film provided with an opening which defines said portion of said ITO film on said ITO film, a step for selectively removing said portion of said ITO film which is exposed through said opening of said resist film, and a step for removing said resist film.

* * * * *